United States Patent [19]

Hashimoto et al.

[11] Patent Number: 4,936,951
[45] Date of Patent: Jun. 26, 1990

[54] METHOD OF REDUCING PROXIMITY EFFECT IN ELECTRON BEAM RESISTS

[75] Inventors: Kazuhiko Hashimoto, Moriguchi; Taichi Koizumi, Osaka; Kenji Kawakita, Neyagawa; Noboru Nomura, Kyoto, all of Japan

[73] Assignee: Matsushita Electric Industrial Co., Ltd., Osaka, Japan

[21] Appl. No.: 262,871

[22] Filed: Oct. 26, 1988

[30] Foreign Application Priority Data

Oct. 26, 1987 [JP] Japan .................. 62-269678
Feb. 26, 1988 [JP] Japan .................. 63-45202

[51] Int. Cl.$^5$ ............................ H01L 21/308
[52] U.S. Cl. .................. 156/643; 156/652; 156/659.1; 156/661.1
[58] Field of Search .......... 156/659.1, 661.1, 643, 156/652, 653

[56] References Cited

U.S. PATENT DOCUMENTS

| | | | |
|---|---|---|---|
| 4,068,018 | 9/1975 | Hashimoto | 427/43.1 |
| 4,222,792 | 9/1979 | Lever | 156/643 |
| 4,311,785 | 1/1982 | Ahne et al. | 430/287 |
| 4,366,230 | 12/1982 | Ahne et al. | 430/287 |
| 4,465,768 | 8/1984 | Ueno et al. | 430/296 |
| 4,504,646 | 3/1985 | Nate et al. | 528/16 |
| 4,521,274 | 5/1984 | Reichmanis | 156/655 |
| 4,556,619 | 12/1985 | Ogata et al. | 430/270 |
| 4,615,782 | 6/1985 | Namatsu | 156/661.1 |
| 4,649,099 | 7/1985 | Oguchi | 156/643 |
| 4,702,993 | 11/1985 | White | 430/313 |
| 4,764,247 | 3/1987 | Leveriza | 156/659.1 |

FOREIGN PATENT DOCUMENTS 59-198448 11/1984 Japan .
63-36239 2/1988 Japan .

Primary Examiner—Kenneth M. Schor
Assistant Examiner—John J. Bruckner
Attorney, Agent, or Firm—Wenderoth, Lind & Ponack

[57] ABSTRACT

A fine pattern forming method capable of forming an accurate fine pattern without charge-up at the time of electron beam or focus ion beam exposure is provided by treating the bottom layer or intermediate layer or silicon containing resist of a multi-layer resist with ion shower irradiation or reducing solvent.

2 Claims, 7 Drawing Sheets

METHOD OF REDUCING PROXIMITY EFFECT IN ELECTRON BEAM RESISTS

BACKGROUND OF THE INVENTION

This invention relates to a fine pattern forming method for forming an arbitrary resist pattern for high precision fine processing on a semiconductor substrate by electron beam or focus ion beam direct writing lithography, using a multi-layer resist system.

In fabrication of IC, LSI, etc., conventionally, patterns were formed by photolithography using ultraviolet rays. Recently, as the pattern size of LSI elements becomes finer, and along with the manufacture of ASIC, electron beam direct writing lithography has come to be employed. Since the electron beam resist used in pattern forming is generally poor in dry etch resistance, and also because the pattern resolution is impaired by the proximity effect due to reflection of the electron beam from the substrate, a multi-layer resist system is used in the electron beam lithography. Of the multilayer resist system, the double-layer resist has a silicon containing resist, which is not mixed therewith, applied on an organic polymer film, and the tri-layer resist has an inorganic film, mainly $SiO_2$ or organic polysiloxane film (SOG) formed between the organic polymer film of the double-layer resist and the resist, and they both function to suppress the proximity effect due to reflection of electrons. In these multi-layer resists, however, since the organic film is very thick, a new problem arises, which is the charge-up effect of electrons by insulation film. As electrons are accumulated on the resist, organic film and $SiO_2$, which are insulation films, pattern deviation, butting error, and field deviation occur, making it impossible to write patterns accurately.

In the electron beam lithography, thus, there are problems in the dry etch resistance of the electron beam resist, proximity effect due to electrons and others, and attempts have been made to solve the problems by introducing the multi-layer resist. When the multi-layer resist system is employed, however, the charge-up effect of electrons is manifest, and it is difficult to draw patterns accurately. To solve this problem within the multilayer resist, therefore, a metal or in particularly a metal foil with high electric conductivity is used in the intermediate layer. For example, instead of SOG or $SiO_2$, a metal foil of Si, W or Al is used, so that the patterns may be drawn accurately while preventing chargeup. However, since metals are used in the resist process, there is a problem of contamination. Besides, for sputter evaporation of metal, the process is complicated and difficult, and it leads to problems in metal etching after pattern formation, and metal peeling, and a problem of drawing in which alignment is difficult because of a decrease of secondary electrons reflected from the substrate because of the presence of the metal foil. In the focus ion beam lithography, too, similar problems to those in the electron beam lithography are known.

SUMMARY OF THE INVENTION

It is hence a primary object of this invention to present a method for forming a fine pattern, by eliminating charge-up due to electron or electric charge, when writing directly with electron beams or focus ion beams by employing the multi-layer resist system.

To achieve the above object, the fine pattern forming method of this invention is intended to write an accurate fine pattern on a multi-layer resist by using an electron beam or ion beam, while raising the thermal conductivity by reducing the film surface and eliminating charge-up at the time of exposure, by applying ion shower irradiation or dropping a reducing solution on the bottom layer organic polymer film or intermediate layer or silicon containing resist of the multi-layer resist.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1A:
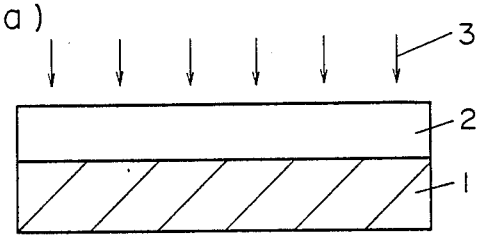
FIGS. 1a-1d are sectional views of a first embodiment of this invention.
Figure 1B:
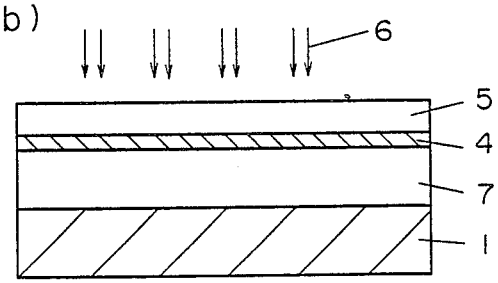
Figure 1C:
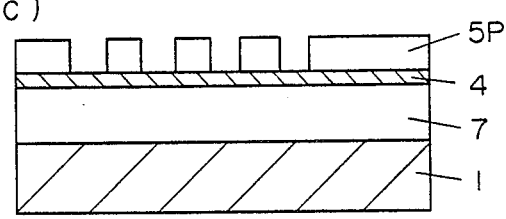
Figure 1D:
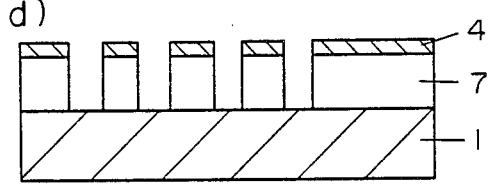
Figure 2A:
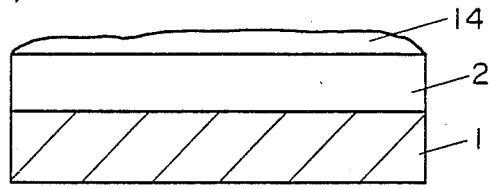
FIGS. 2a-2d are sectional views of a second embodiment.
Figure 2B:
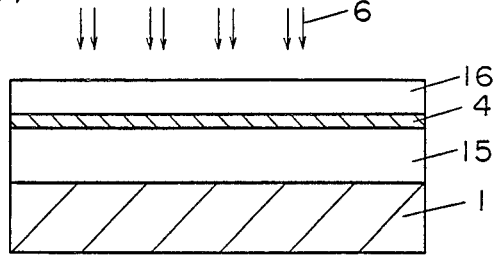
Figure 2C:
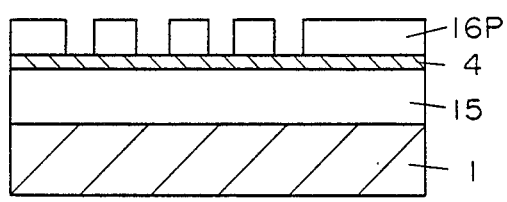
Figure 2D:
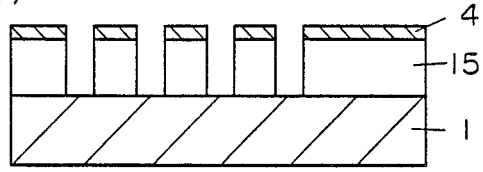
Figure 3A:
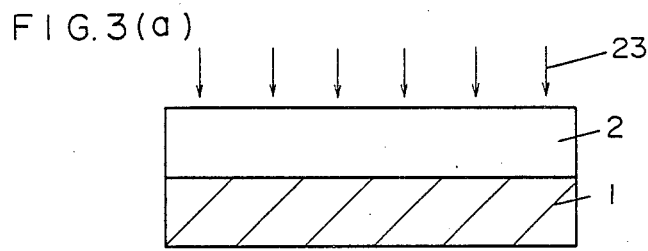
FIGS. 3a-3d are sectional views of a third embodiment.
Figure 3B:
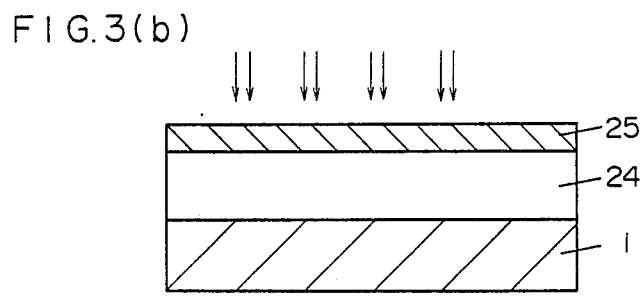
Figure 3C:
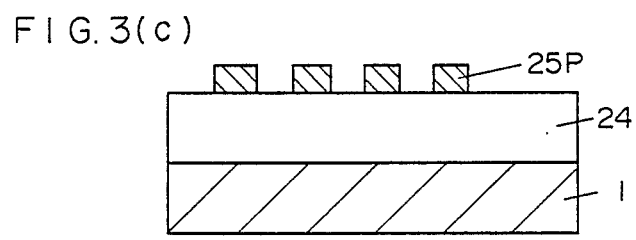
Figure 3D:
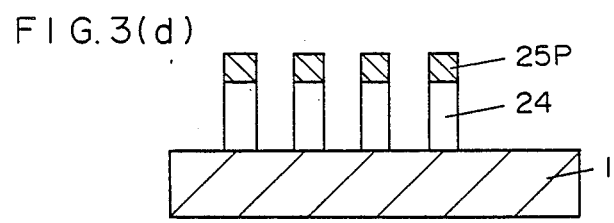
Figure 4A:
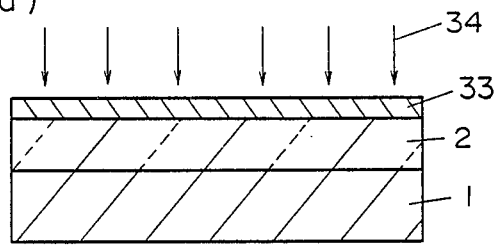
FIGS. 4a-4d are sectional views of a fourth embodiment.
Figure 4B:
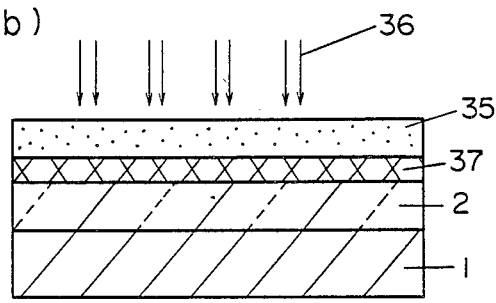
Figure 4C:
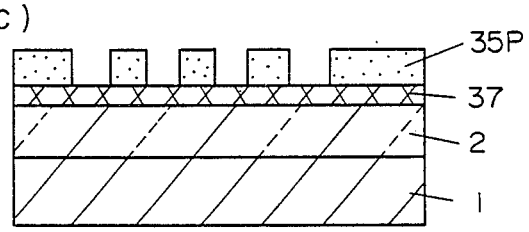
Figure 4D:
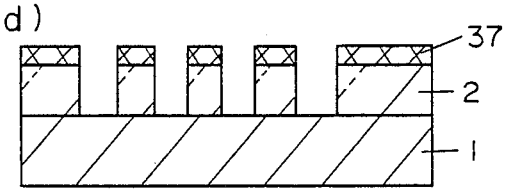
Figure 5A:
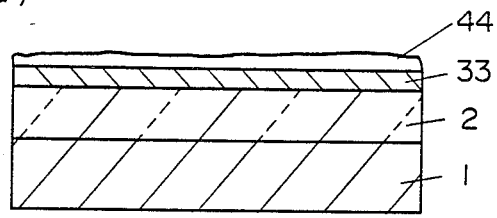
FIGS. 5a-5d are sectional views of a fifth embodiment.
Figure 5B:
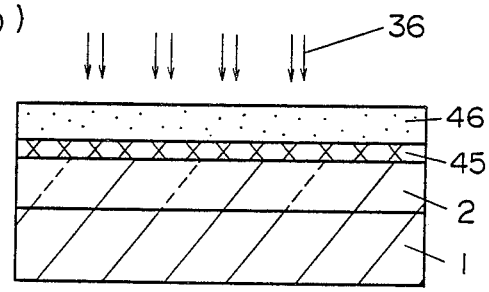
Figure 5C:
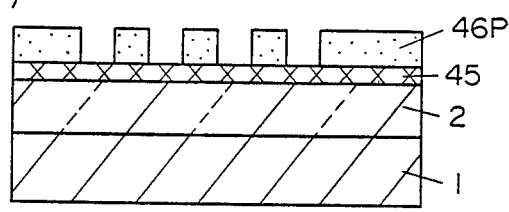
Figure 5D:
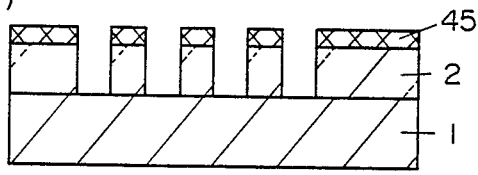
Figure 6A:
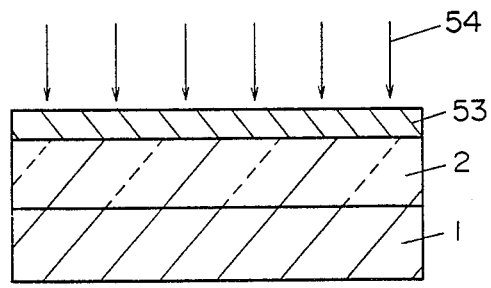
FIGS. 6a-6d are sectional views of a sixth embodiment.
Figure 6B:
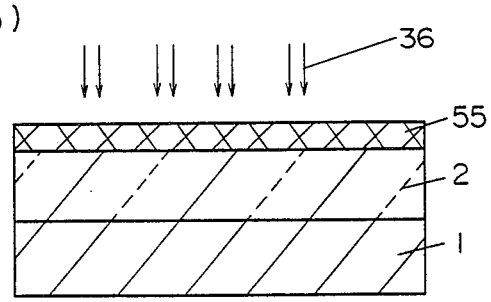
Figure 6C:
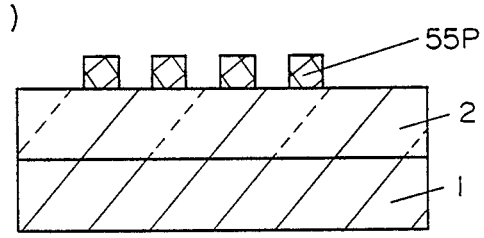
Figure 6D:
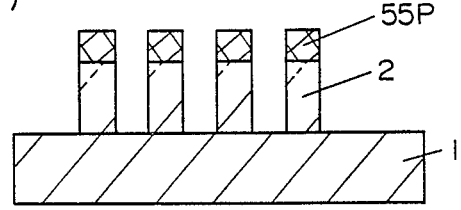

A first embodiment of this invention is shown in FIGS. 1a-1d. On a semiconductor substrate 1 (an insulation film or conductor film is often formed on the surface), an organic polymer film was applied as a bottom layer 2, and the whole surface was irradiated at once with $H^+$ ions 3 at accelerating voltage of 40 kV and dosage of $1 \times 10^{16}$ ions/cm$^2$ (a). Then SOG 4 as intermediate layer and PMMA resist 5 as top layer resist were applied by spin coating, and the surface was subjected to electron beam exposure 6 at accelerating voltage of 20 kV and dosage of 100 $\mu$C/cm$^2$ (b), and the organic polymer film exposed to $H^+$ ion irradiation was heightened in electric conductivity 7. After developing for 60 seconds in a mixture of methyl isobutyl ketone (MIBK) and isopropyl alcohol (IPA), an accurate fine pattern was formed (c). Using this resist pattern 5p as mask, the intermediate layer SOG 4 was dry etched, and the bottom layer 7 was etched, and an ultrafine pattern of 0.25 $\mu$m line and space in vertical shape was formed (d). As the SOG 4, other insulation film may be used as far as serving as the etching mask of the bottom layer 7, and in consideration of the etching selectivity it is desired to use an organic film containing silicon.

Thus, according to this embodiment, charge-up can be prevented by electron beam direct writing, using a tri-layer resist having the organic polymer film in the bottom layer irradiated with $H^+$ ions, so that an accurate fine pattern may be formed. Or, aside from $H^+$ ions, gases such as $SiH_4$, $SO_2$ and CO may be used for ion irradiation.

A second embodiment of the invention is shown in FIGS. 2a-2d. A bottom layer 2 was applied on a semiconductor substrate 1, and an aldehyde solution 14 was dropped on the surface, and after letting stand for 1 minute, the surface was dried by spinning (a). Next, SOG 4 as an intermediate layer and PMMA resist 16 as top layer resist were applied by spin coating, and the surface was exposed to electron beam 6 at accelerating voltage of 20 kV and dosage of 100 $\mu C/cm^2$ (b). Since the organic polymer film treated with aldehyde solution was heightened in the electric conductivity 15, an accurate fine pattern was formed when developed for 60 seconds in a mixture of MIBK and IPA (c). Using this resist pattern 16p as mask, the intermediate layer SOG 4 and bottom layer 15 were dry etched, and an ultrafine pattern in vertical shape was formed (d).

According to this embodiment, in this way, by electron beam direct writing using a tri-layer resist treated with aldehyde solution in the bottom layer, charge-up can be prevented, and an accurate fine pattern can be formed. Aside from aldehyde solution, meanwhile, any reducing solution may be used such as $(COOH)_2$ and $H_2SO_3$.

A third embodiment of the invention is shown in FIGS. 3a–3d. A bottom layer 2 was applied on a semiconductor substrate 1, and the whole surface was irradiated at once with $H^{30}$ ions 23 at accelerating voltage of 40 kV and dosage of $1 \times 10^{16}$ ions/cm$^2$ (a). Next, on this surface, SNR which is a silicon containing resist 25 was applied by spin coating, and the surface was exposed to electron beams at accelerating voltage of 20 kV and dosage of 10 $\mu C/cm^2$ (b). Since the bottom layer irradiated with $H^{30}$ ions was heightened in the electric conductivity 24, an accurate fine pattern was formed when developed for 30 seconds in an exclusive developer (c). Using this resist pattern 25p as mask, the bottom layer was dry etched, and an ultrafine pattern in vertical shape could be formed (d).

In this embodiment, as clear from the description herein, charge-up can be prevented by irradiating the bottom layer of a double-layer resist with $H^{30}$ ions or other ions, so that an accurate fine pattern can be formed. Besides, a similar effect may be obtained by treating the surface with a reducing solution such as aldehyde solution.

Figure 7:
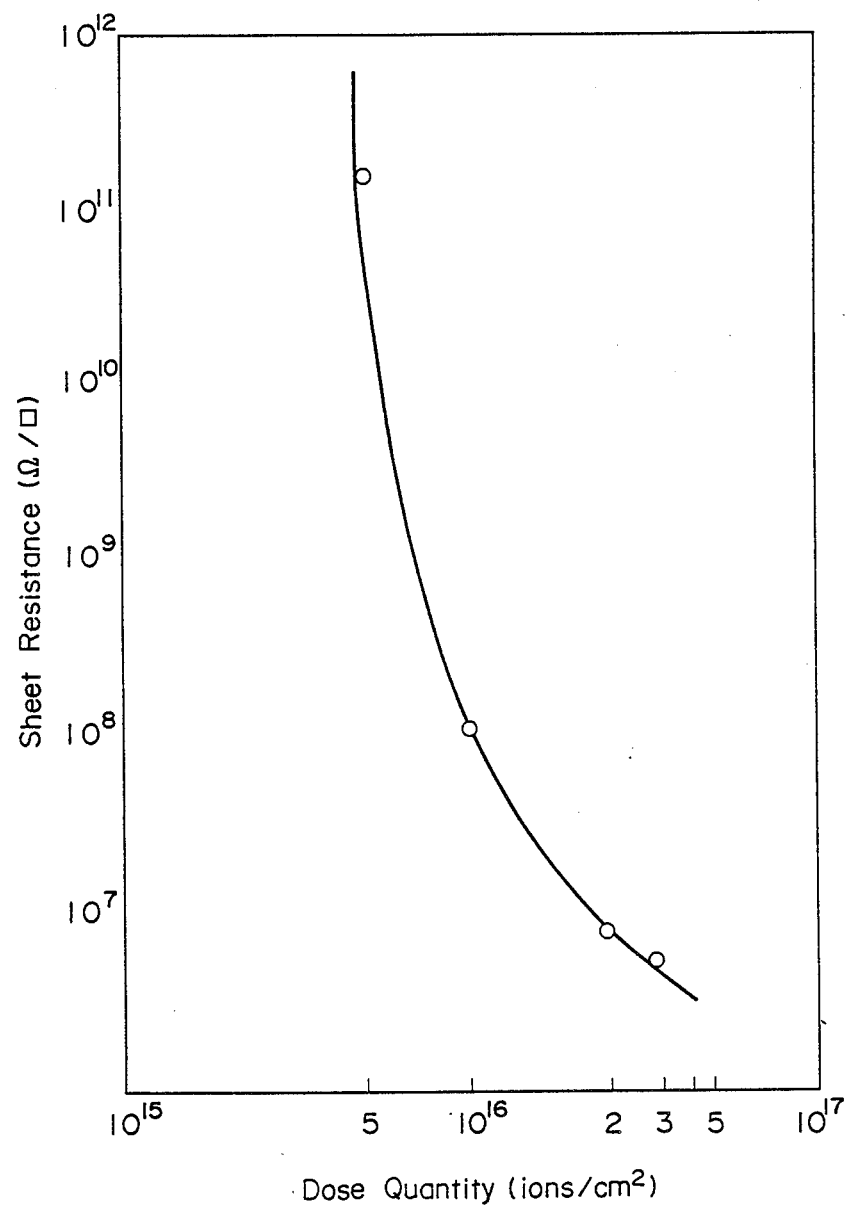
FIG. 7 is a characteristic diagram showing the relation between sheet resistance and dosage when the bottom layer film is irradiated with $H^+$ ions.

FIG. 7 shows the relation between the sheet resistance and dosage after irradiation of $H^{30}$ ions at accelerating voltage of 40 kV on an organic polymer film. It is known from this diagram that, when the dosage exceeds $1 \times 10^{16}$ ions/cm$^2$, the sheet resistance drops suddenly, becoming less than $10^8$ ohms/□. Therefore, by irradiating the bottom layer with ions before electron beam exposure or focus ion beam exposure, the electric conductivity can be raised, and charge-up due to electrons or electric charge particles at the time of exposure can be prevented.

In these embodiment, the electron beam exposure is employed, but a focus ion beam exposure may be similarly employed. Also a similar effect may be obtained by using a resist for electric charge beam other than a PMMA resist.

In the above-mentioned process of the invention, by treating the organic polymer film as the bottom layer of a multi-layer resist with ion irradiation or reducing solution, the electric conductivity can be raised, and an accurate fine pattern can be formed by preventing charge-up at the time of electron beam or focus ion beam exposure. Therefore, this process acts effectively in an accurate pattern writing when directly writing with electric charge beam by using a multi-layer resist.

A fourth embodiment of the invention is shown in FIGS. 4a–4d. A semiconductor substrate 1 was coated with an organic polymer film as a bottom layer 2, and SOG 33 was applied on the surface by spin coating. This entire surface was irradiated at once with $H^{30}$ ions 34 at accelerating voltage of 40 kV and dosage of $1 \times 10^{16}$ ions/cm$^2$ (a). Next, as top layer resist, PMMA resist 35 was applied by spin coating, and electron beam 36 exposure was effected at the accelerating voltage of 20 kV and dosage 100 $\mu C/cm^2$ (b). The SOG exposed to $H^{30}$ ions was heightened in the electric conductivity 37. By developing for 60 seconds in a mixture of methyl isobutyl ketone (MIBK) and isopropyl alcohol (IPA), an accurate fine pattern was formed (c). Using this resist pattern 35p as mask, the intermediate layer SOG was dry etched, and the bottom layer was etched, and a fine pattern in vertical shape was formed (d).

Thus, according to this embodiment, by performing electron beam direct writing lithography using a tri-layer resist having the intermediate layer SOG irradiated with $H^{30}$ ions, charge-up can be prevented, and an accurate fine pattern can be formed. Besides $H^{30}$ ions, meanwhile, any reducing gas such as CO and $SO_2$ may be used.

A fifth embodiment of the invention is shown in FIGS. 5a–5d. A bottom layer 2 was applied on a semiconductor substrate 1, and SOG 33 was applied thereon by spin coating. An aldehyde solution 44 was dropped on it, and was dried by spinning after letting stand for 1 minute (a). Next, as a top layer resist, PMMA resist 46 was applied by spin coating, and an electron beam 36 exposure was effected at accelerating voltage of 20 kV and dosage of 100 $\mu C/cm^2$ (b). Since the SOG, of which the surface was treated with aldehyde solution was heightened in the electric conductivity 45, an accurate fine pattern was formed by developing for 60 seconds in a mixture of MIBK and IPA (c). Using this resist pattern 46p as mask, the intermediate layer SOG and bottom layer were dry etched, and a fine pattern of vertical shape could be formed (d).

Thus, according to this embodiment, by electron beam direct writing lithography using a tri-layer resist having the surface of an intermediate layer SOG treated with aldehyde solution, charge-up can be prevented, and an accurate fine pattern can be formed. Aside from aldehyde solution, any reducing substance may be used such as $(COOH)_2$ and $H_2SO_3$.

A sixth embodiment of the invention is shown in FIGS. 6a–6d. A bottom layer 2 was applied on a semiconductor substrate 1, and SNR which is a silicon containing resist 53 was applied thereon as top layer resist by spin coating. The entire surface was irradiated at once with $H^{30}$ ions 54 at accelerating voltage of 40 kV and dosage of $1 \times 10^{14}$ ions/cm$^2$ (a). Then the surface was exposed to electron beams 36 at accelerating voltage of 20 kV and dosage of 10 $\mu C/cm^2$ (b). Since the silicon containing resist irradiated with $H^{30}$ ions was heightened in the electric conductivity 55, when developed for 30 seconds in an exclusive developer, an accurate fine pattern was formed (c). Using this resist pattern 55P as mask, the bottom layer was dry etched, and a fine pattern of vertical shape was formed (d).

In this embodiment, therefore, by irradiating the top layer resist of a double-layer resist with $H^{30}$ ions or other reducing gas ions, charge-up can be prevented, and an accurate fine pattern can be formed. Or a similar effect may be obtained by treating the surface with a substance acting as a reducing agent such as aldehyde solution. Besides, a similar effect will be obtained by a focus ion beam using electric charge particles, other than the electron beam.

This invention, by the process described herein, can raise the electric conductivity, prevent the chargeup at the time of electron beam or focus ion beam exposure, and form an accurate fine pattern, by treating the silicon containing resist as the top layer resist of a double-layer resist with ion shower irradiation or reducing solution. Therefore, this process acts effectively on accurate pattern drawing in the event of electric charge beam direct writing lithography by using a multi-layer resist.

As explained herein, according to this invention, by irradiating the organic polymer film used as the bottom layer of a multi-layer resist with ion shower or reducing it with reducing solvent, the charge-up in the event of electron beam or focus ion beam exposure may be prevented.

Moreover, by reducing the intermediate layer, i.e. an organic polysiloxane film of a tri-layer resist, by reducing gas ion or reducing solvent, charge-up in the event of electron beam or focus ion beam exposure can be prevented, and an accurate fine pattern can be formed. Besides, by similarly reducing the silicon containing resist of the top layer of a double-layer resist, chargeup in the event of exposure can be prevented, and an accurate fine pattern can be formed, which may greatly contribute to the ultralarge scale integrated circuit.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A fine pattern forming method comprising the steps of:
   (a) applying an organic polymer film on a semiconductor substrate;
   (b) treating said organic polymer film surface with an electrical resistance reducing solution selected form the group consisting of aldehyde, sulphurous acid and $(COOH)_2$;
   (c) forming an insulation film on the treated organic polymer film;
   (d) forming a radiation-sensitive resist film on said insulation film;
   (e) forming a predetermined pattern in said radiation-sensitive resist film by exposing said resist film to a radiation beam and thereafter developing said radiation-sensitive resist film;
   (f) etching said insulation film using said predetermined pattern of said radiation-sensitive resist film as a mask; and
   (g) etching said organic polymer film using the etched insulation film as a mask.

2. A fine pattern forming method comprising the steps of:
   (a) applying an organic polymer film on a semiconductor substrate;
   (b) forming an organic polysiloxane film on said organic polymer film;
   (c) treating the surface of said organic polysiloxane film with an electrical resistance reducing solution selected from the group consisting of aldehyde, sulphurous acid and $(COOH)_2$;
   (d) forming a radiation-sensitive resist film on the treated organic polysiloxane film;
   (e) forming a predetermined pattern in said radiation-sensitive resist film by exposing said resist film to a radiation beam and thereafter developing said radiation-sensitive resist film;
   (f) etching said organic polysiloxane film using said predetermined pattern of said radiation-sensitive resist film as a mask; and
   (g) etching said organic polymer film using the etched organic polysiloxane film as a mask.

* * * * *